US012625199B2

(12) United States Patent
Cho et al.

(10) Patent No.: US 12,625,199 B2
(45) Date of Patent: May 12, 2026

(54) PIN PUSH INSPECTION CONNECTOR

(71) Applicant: LG ENERGY SOLUTION, LTD.,
Seoul (KR)

(72) Inventors: Hyun Cho, Daejeon (KR); **Ki-Seok
Sung, Daejeon (KR); Dong-Ju Shin**,
Daejeon (KR); Seung-Hee Chae,
Daejeon (KR)

(73) Assignee: LG ENERGY SOLUTION, LTD.,
Seoul (KR)

( * ) Notice: Subject to any disclaimer, the term of this
patent is extended or adjusted under 35
U.S.C. 154(b) by 202 days.

(21) Appl. No.: 18/016,954

(22) PCT Filed: Apr. 15, 2022

(86) PCT No.: PCT/KR2022/005491
§ 371 (c)(1),
(2) Date: Jan. 19, 2023

(87) PCT Pub. No.: WO2022/239982
PCT Pub. Date: Nov. 17, 2022

(65) Prior Publication Data
US 2023/0288499 A1 Sep. 14, 2023

(30) Foreign Application Priority Data

May 12, 2021 (KR) ........................ 10-2021-0061289

(51) Int. Cl.
*G01R 31/68* (2020.01)

(52) U.S. Cl.
CPC .................................. *G01R 31/68* (2020.01)

(58) Field of Classification Search
CPC ........ G01R 31/54; G01R 31/66; G01R 31/68;
G01R 31/69; G01R 1/0466; G01R 1/073;
G01R 31/2808; G01R 31/2863
See application file for complete search history.

(56) References Cited

U.S. PATENT DOCUMENTS 4,777,445 A 10/1988 Kahl
5,030,906 A * 7/1991 Duff ......................... G01R 1/04
324/756.02

(Continued)

FOREIGN PATENT DOCUMENTS

EP 3833929 B1 * 10/2022 ........... G01B 5/0025
JP 8-306463 A 11/1996

(Continued)

OTHER PUBLICATIONS

Extended European Search Report for European Application No.
22807630.3, dated Mar. 7, 2024.

(Continued)

*Primary Examiner* — Feba Pothen
(74) *Attorney, Agent, or Firm* — Birch, Stewart, Kolasch
& Birch, LLP

(57) ABSTRACT

Discussed is a pin push inspection connector that can
include a first connector assembly having a front portion
adapted to connect to a connector under test in a first
direction and to be fixedly coupled to the connector under
test; and a second connector assembly having a front portion
connected to a rear portion of the first connector assembly in
the first direction and provided so that a connection interval
with respect to the first connector assembly is variably
adjusted in the first direction or a second direction that is
opposite to the first direction. The second connector assem-
bly can include at least one inspection pin provided therein
to be connected to at least one terminal pin provided in the
connector under test.

12 Claims, 8 Drawing Sheets

(56)                    References Cited

U.S. PATENT DOCUMENTS

| | | | |
|---|---|---|---|
| 9,692,158 B1 * | 6/2017 | Vinther | ............. H01R 13/6395 |
| 2010/0271043 A1 | 10/2010 | Katoh | |
| 2020/0011920 A1 | 1/2020 | Watanabe et al. | |

FOREIGN PATENT DOCUMENTS

| JP | 2563069 Y2 | 2/1998 |
|---|---|---|
| JP | 11-329614 A | 11/1999 |
| JP | 2009-163953 A | 7/2009 |
| JP | 2020-8388 A | 1/2020 |
| KR | 20-0453172 Y1 | 4/2011 |
| KR | 10-2015-0110170 A | 10/2015 |
| KR | 10-1574053 B1 | 12/2015 |
| KR | 10-1757834 B1 | 7/2017 |
| KR | 10-1890230 B1 | 8/2018 |
| KR | 10-2159271 B1 | 9/2020 |
| WO | WO 2020/030206 A1 | 2/2020 |

OTHER PUBLICATIONS

International Search Report (PCT/ISA/210) issued in PCT/KR2022/005491, dated Aug. 2, 2022.

* cited by examiner

FIG. 4

LENGTH OF PIN PUSH[mm]

PIN PUSH INSPECTION CONNECTOR

TECHNICAL FIELD

The present disclosure relates to an inspection connector that may be used in an end of line (EOL) process in the production of various connectors, and more particularly, to a pin push inspection connector that may be used in a function test for finally checking whether there is product abnormality after the assembly of various connector products is completed and checking whether pins of an assembled connector are pushed backward from correct positions and assembled (defective state).

The present application claims priority to Korean Patent Application No. 10-2021-0061289 filed on May 12, 2021 in the Republic of Korea, the disclosures of which are incorporated herein by reference.

BACKGROUND ART

In general, a number of components are installed in a vehicle, an air conditioner, a refrigerator, a washing machine, a battery pack, or the like, and a complex wiring circuit is used to connect components to other components or supply power. Because the wiring circuit is quite complicated, it is effective to install the plurality of components and then form the wiring circuit. To this end, a cable connector implemented by connecting a plurality of cables is frequently used.

A cable connector includes electrical cables, terminal pins connected to ends of the electrical cables, and a connector housing into which the terminal pins are inserted and fixed. The number of terminal pins or the size of the connector housing may vary according to a product to be applied.

In the case of a connector, a plurality of terminal pins and a plurality of cables should be correctly connected, and the terminal pins connected to the cables should be correctly inserted into a connector housing. However, in a manufacturing process, for some reasons, the terminal pins may not be inserted into the connector housing to correct positions. In this case, because signal transmission or power supply through the connector is not performed, a product using the cable connector may not operate normally.

Accordingly, in the case of cable connectors, only normal products are shipped through a final test process of checking there is malfunction after assembly and checking an assembled state of a plurality of terminal pins and a connector housing.

Currently, X-ray imaging, Dino inspection (digital microscope inspection), etc. are performed to determine whether a connector has a poor pin assembled state, and because an inspection time and a tact time increase due to the process and productivity is deteriorated, improvement is required.

DISCLOSURE

Technical Problem

The present disclosure is designed to solve the problems of the related art, and therefore the present disclosure is directed to providing a means for easily determining whether a pin of a connector under test is pushed, thereby omitting X-ray imaging and Dino inspection.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In an aspect of the present disclosure, there is provided a pin push inspection connector including a first connector assembly having a front portion adapted to connect to a connector under test in a first direction and to be fixedly coupled to the connector under test, and a second connector assembly having a front portion connected to a rear portion of the first connector assembly in the first direction and provided so that a connection interval with respect to the first connector assembly is variably adjusted in the first direction or a second direction that is opposite to the first direction, wherein the second connector assembly includes at least one inspection pin provided therein to be connected to at least one terminal pin provided in the connector under test.

The first connector assembly may include a first fastening hole extending in the first direction from a rear end portion of the first connector assembly, and the second connector assembly may include a length adjusting bolt passing through a body of the second connector assembly and screwed into the first fastening hole to a certain depth.

The second connector assembly may further include a second fastening hole extending in the first direction and having a thread formed on an inner circumferential surface thereof, and a length fixing bolt screwed into the second fastening hole and provided to support the rear end portion of the first connector assembly.

The length adjusting bolt may be provided in a pair, and the pair of length adjusting bolts may be respectively provided on a left edge and a right edge of the second connector assembly.

The length fixing bolt may be provided in a pair, and the pair of length fixing bolts may be provided between the pair of length adjusting bolts.

The at least one inspection pin may be fixed in the second connector assembly to move integrally with the second connector assembly in the first direction or the second direction with respect to the first connector assembly.

The first connector assembly may include a latch provided to be engaged with a locking protrusion provided on an outer portion of the connector under test.

The first connector assembly may include a first housing including a first main body formed in a hollow structure and a first wing body integrally formed on opposite sides of the first main body, and a guide pin extending from the first wing body in the first direction beyond the first main body.

The first connector assembly may include a first housing including a first main body formed in a hollow structure and a first wing body integrally formed on opposite sides of the first main body, and a guide pin extending from the first wing body in the first direction beyond the first main body, wherein the length fixing bolt is provided so that a front end portion of the length fixing bolt supports a rear end of the guide pin located on the first wing body.

The at least one inspection pin may include a plurality of inspection pins, and is provided to be connected in a one-to-one plug-in manner to each terminal pin of the connector under test.

Advantageous Effects

According to an aspect of the present disclosure, there may be provided a pin push inspection connector in which whether a terminal pin of a connector under test is pushed may be easily determined because a contact point with the terminal pin of the connector under test may be variably adjusted.

Because existing X-ray imaging and Dino inspection may be omitted when the pin push inspection connector is used, an inspection time and a tack time may be reduced and connector productivity may be improved.

The effects of the present disclosure are not limited to the effects mentioned above, and other effects not mentioned will be clearly understood by one of ordinary skill in the art from the specification and the attached drawings.

DESCRIPTION OF DRAWINGS

FIG. 4 is a view illustrating an example where a pin push inspection connector and a connector under test are fastened to each other according to an embodiment of the present disclosure.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Also, the description proposed herein is just a preferable example for the purpose of illustrations only, not intended to limit the scope of the present disclosure, so it should be understood that other equivalents and modifications could be made thereto without departing from the scope of the present disclosure.

Figure 1:
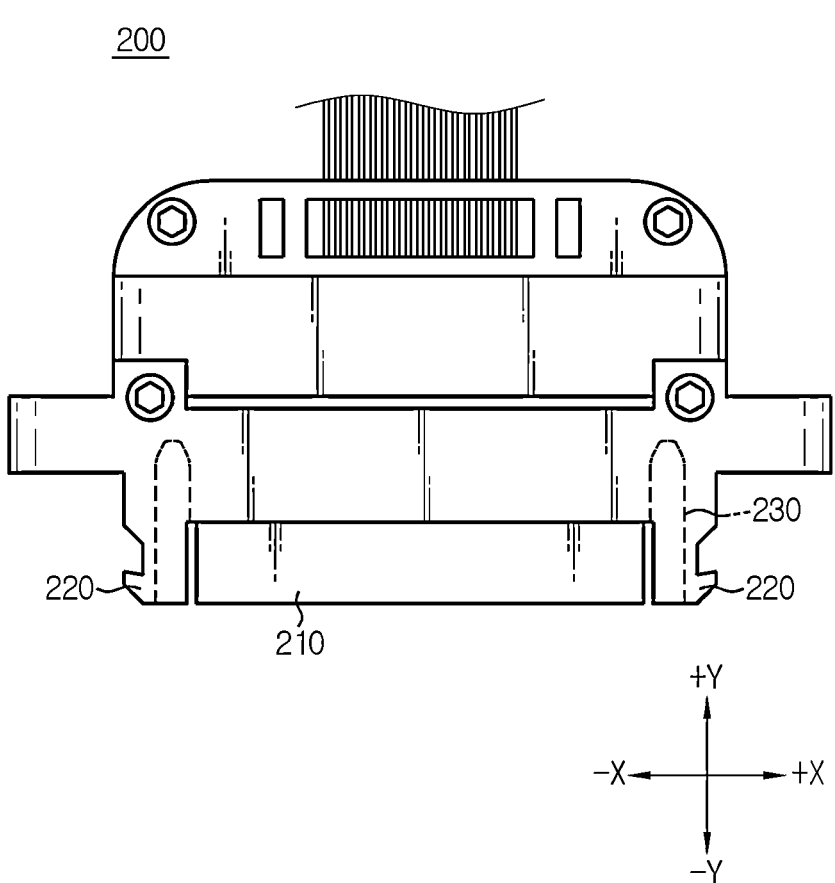
FIG. 1 is a view illustrating a connector under test that may be inspected by a pin push inspection connector according to an embodiment of the present disclosure.
Figure 2:
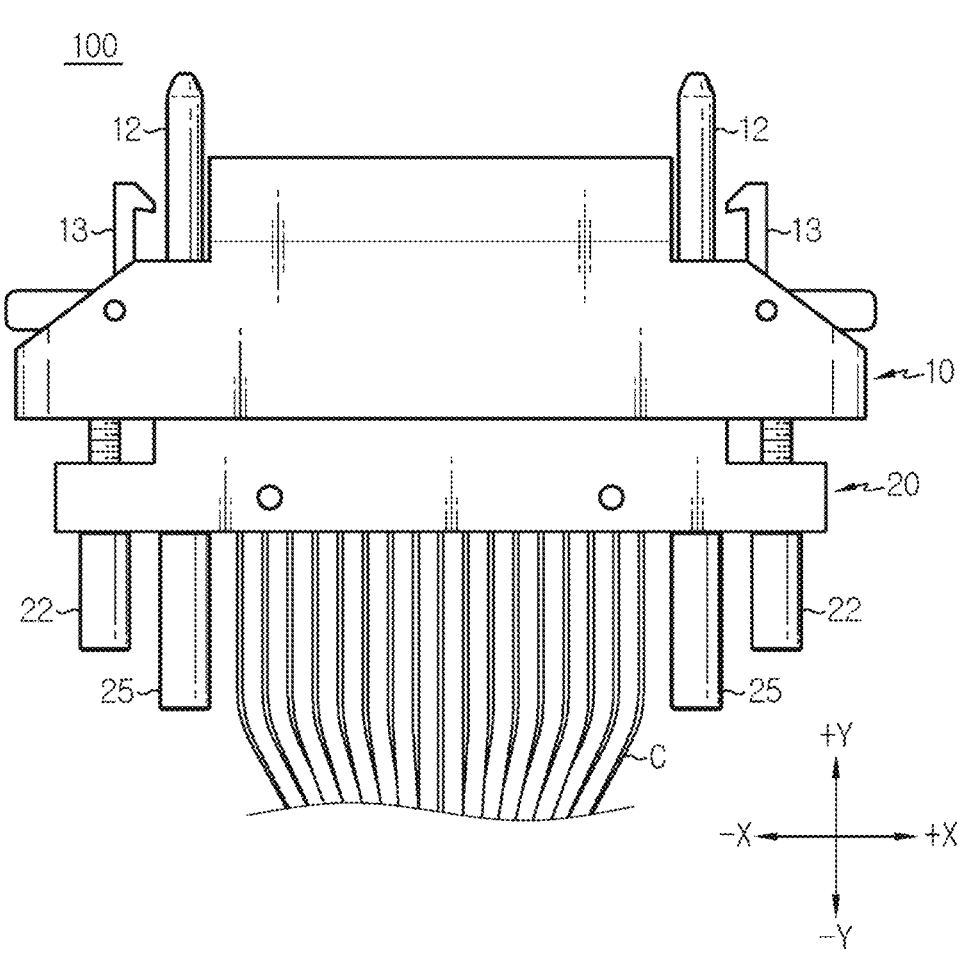
FIG. 2 is a photograph showing a pin push inspection connector according to an embodiment of the present disclosure.
Figure 3:
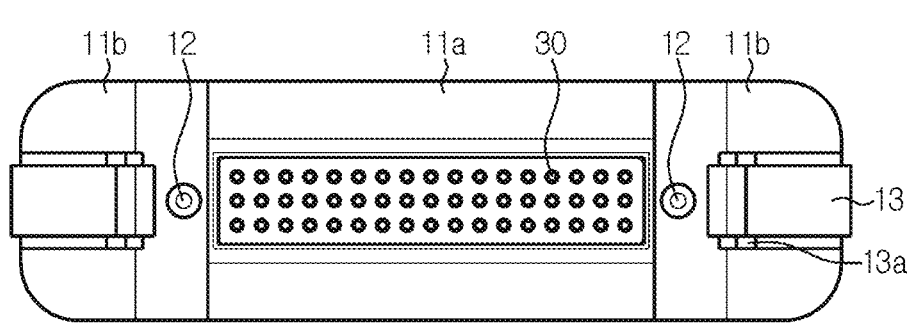
FIG. 3 is a front view illustrating the pin push inspection connector of FIG. 2.

FIG. 1 is a view illustrating a connector under test that may be inspected by a pin push inspection connector according to an embodiment of the present disclosure. FIG. 2 is a photograph showing a pin push inspection connector according to an embodiment of the present disclosure.

A pin push inspection connector 100 according to an embodiment of the present disclosure may be used as an inspection means that is directly connected to a connector under test 200 to check whether all terminal pins P of the connector under test 200 are pushed.

As shown in FIG. 1, the connector under test 200 refers to a connector including a plurality of terminal pins P connected in a one-to-one manner to a plurality of cables and a housing into which the plurality of terminal pins P are inserted. The number and shape of terminal pins P in the connector under test 200 may be determined according to characteristics of a product to be applied, and as shown in FIG. 2, the pin push inspection connector 100 may be connected to correspond to the connector under test 200.

For example, the connector under test 200 may be a sensing cable connector used in a battery module (pack) to transmit various data such as a voltage or a temperature to a battery management system (BMS). The pin push inspection connector 100 according to the present embodiment may be connected in a plug-in manner to the sensing cable connector, and may include the same number of inspection pins 30 as the terminal pins P of the sensing cable connector. When the terminal pins P of the sensing cable connector are of a female type, the inspection pins 30 may be of a male type, and in contrast, when the terminal pins P is of a male type, the inspection pins 30 may be of a female type.

Also, as described below in detail, because the pin push inspection connector 100 is configured so that a contact point between the inspection pins 30 and the terminal pins P is variably adjustable before or after the pin push inspection connector 100 is fastened to the connector under test 200, the pin push inspection connector 100 may be used to determine whether the terminal pins P are pushed backward from pre-determined positions and assembled (defective state) in a final function test after the assembly of the connector under test 200.

Main elements of the pin push inspection connector 100 according to an embodiment of the present disclosure will be described in detail with reference to FIGS. 3 through 7. The pin push inspection connector 100 may include a first connector assembly 10, a second connector assembly 20, and at least one inspection pin 30, and may be provided as a complementary connector connectable to the connector under test 200.

Figure 4:
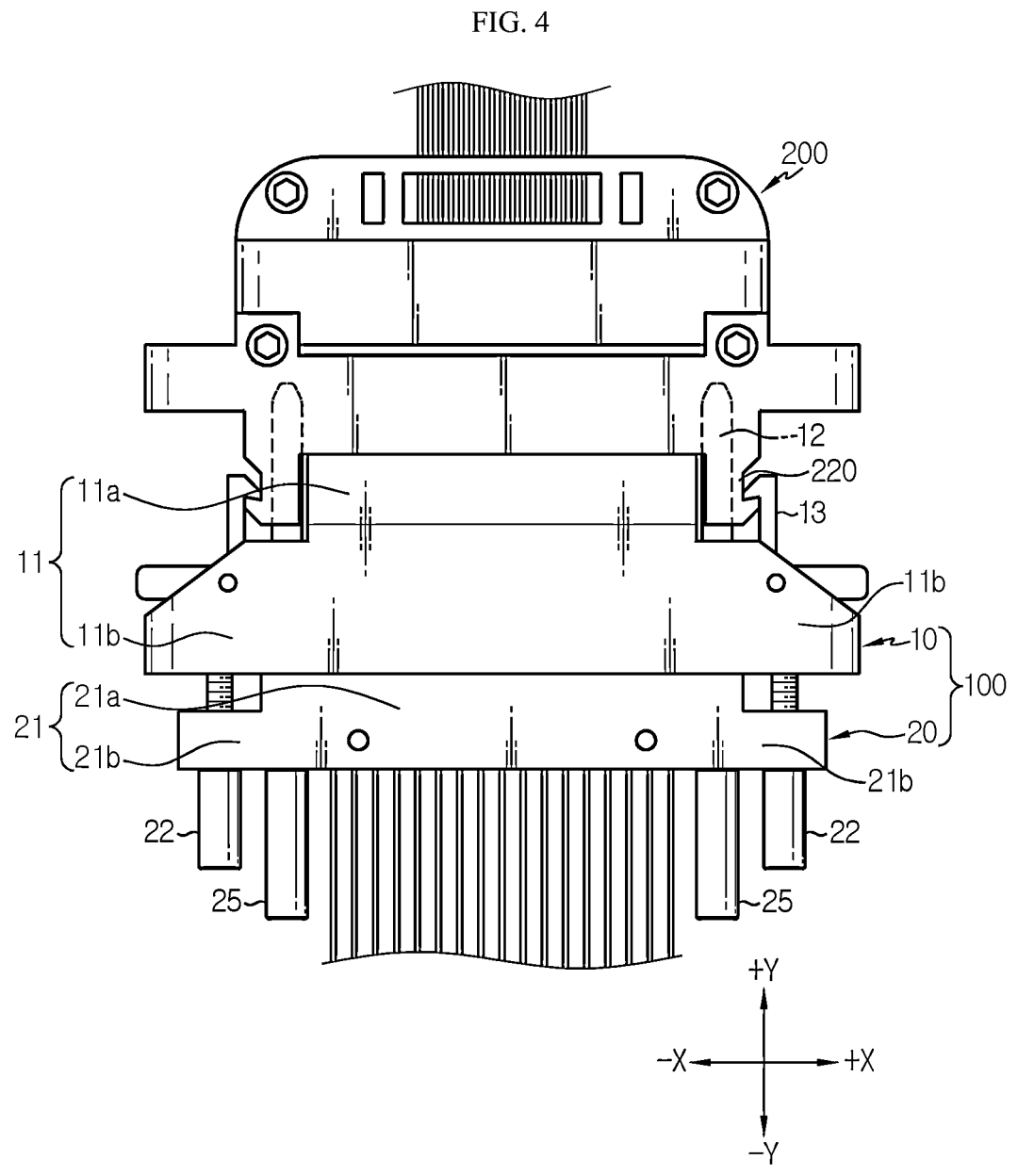
Figure 5:
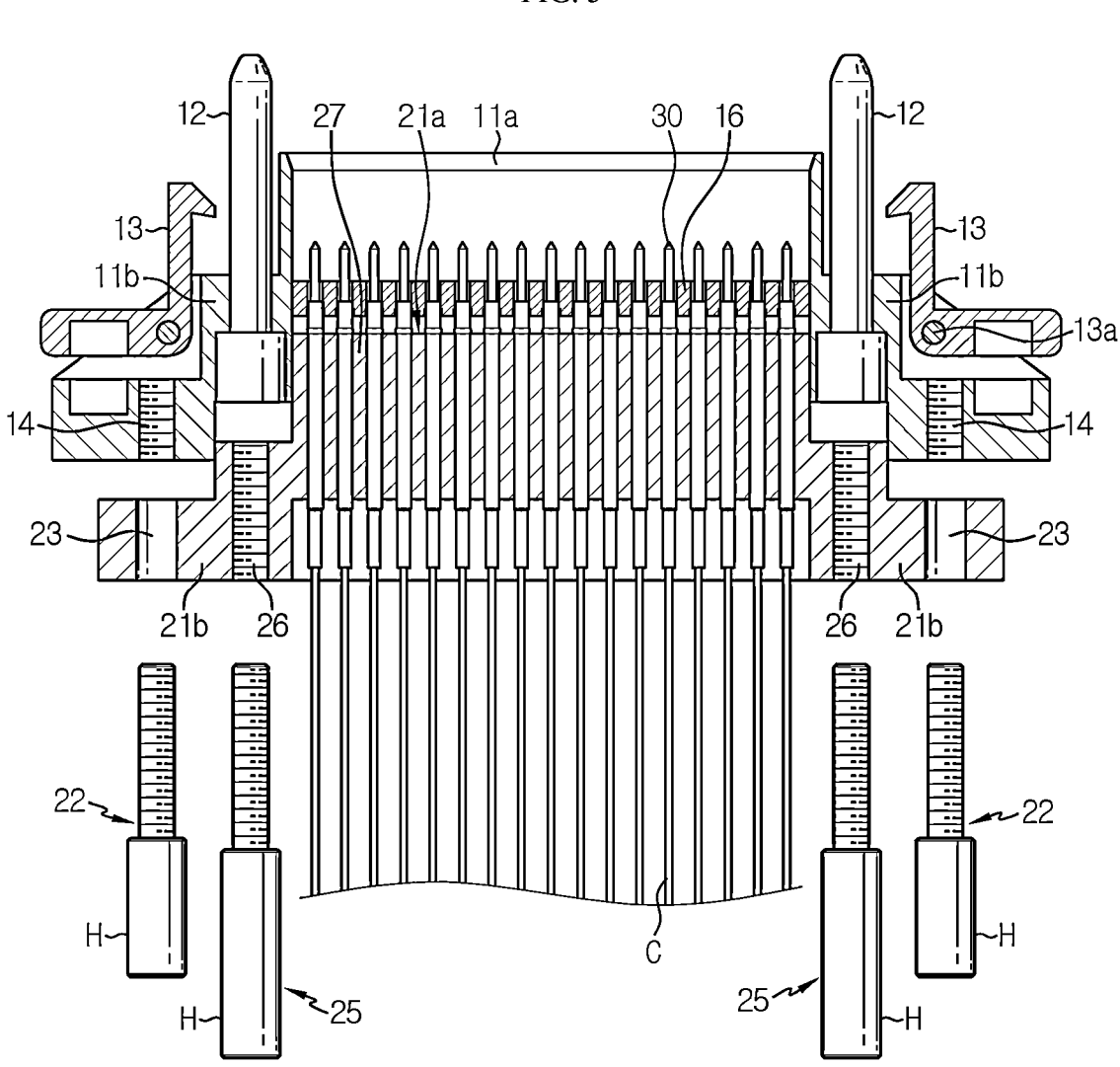
FIG. 5 is a cross-sectional view schematically illustrating main elements of a pin push inspection connector according to an embodiment of the present disclosure.

Referring to FIGS. 4 and 5, the first connector assembly 10 may include a first housing 11, a guide pin 12, a latch 13, and a first fastening hole 14, may be connected to the connector under test 200, and may be fixedly coupled to the connector under test 200.

The first housing 11 may include a first main body 11a of a central portion formed in a hollow structure and a first wing body 11b integrally formed on both sides of the first main body 11a, and one guide pin 12 and one latch 13 may be provided on the first wing body 11b.

The guide pin 12 may be fixedly coupled to the first wing body 11b and may extend in a first direction +Y from the first wing body 11b beyond the first main body 11a, and the latch 13 may be formed in a substantially '┑'-shaped bent structure and may rotate by a certain angle with respect to a hinge shaft 13a at a bent area in a direction intersecting the first direction +Y.

The connector under test 200 (see FIG. 1) may include a connection portion 210 inserted into a middle portion of the first housing 11 and a locking protrusion 220 provided on both sides with the connection portion 210 therebetween. The terminal pins P may be located in the connection portion 210, and a guide groove 230 into which the guide pin 12 may be inserted may be formed in the locking protrusion 220.

In this configuration, a front portion of the first main body 11a of the first housing 11 may be connected and fixed to the connector under test 200 in the first direction +Y. In more detail, (see FIG. 4), the connection portion 210 of the connector under test 200 may be inserted into the first main body 11a of the first housing 11, and the guide pin 12 may be inserted into the guide groove 230 of the connector under test 200. In this case, a length of the guide pin 12 and a depth of the guide groove 230 of the connector under test 200 may be determined so that, when the guide pin 12 reaches the end of the guide groove 230 of the connector under test 200, the connection portion 210 of the connector under test 200 is no longer inserted into the first housing 11.

As described above, in a state where the connection portion 210 of the connector under test 200 is inserted into the first main body 11a of the first housing 11 and the guide pin 12 is inserted into the guide groove 230 of the connector under test 200, when the latch 13 is engaged with the locking protrusion 220 of the connector under test 200, the first connector assembly 10 does not move in the first direction +Y or a second direction −Y with respect to the connector under test 200.

Also, as shown in FIG. 5, the first connector assembly 10 may include the first fastening hole 14 extending from a surface of a rear end portion of the first connector assembly 10 to a certain depth in the first direction +Y. The rear end portion of the first connector assembly 10 refers to a rear end portion of the first wing body 11b on both sides of the first housing 11 in the present embodiment. A thread may be provided on an inner circumferential surface of the first fastening hole 14, and a rod portion of a length adjusting bolt 22 may be screwed into the first fastening hole 14.

Referring back to FIGS. 4 and 5, a front portion of the second connector assembly 20 may be connected in the first direction +Y to a rear portion of the first connector assembly 10. Also, a connection interval between the second connector assembly 20 and the first connector assembly 10 may be variably adjusted when necessary in the first direction +Y or a second direction −Y that is opposite to the first direction +Y.

The second connector assembly 20 may include a second housing 21, the inspection pins 30, the length adjusting bolt 22, and a length fixing bolt 25.

The second housing 21 may include a second main body 21a that may be partially inserted into the first main body 11a, and a second wing body 21b integrally formed on both sides of the second main body 21a.

The inspection pins 30 may be connected to an extension line C for a continuity test, and may be provided in a state of being fixedly assembled to the second main body 21a.

Each inspection pin 30 may be fixed in a press-fit or snap-fit manner to a pin holder 27 provided in the second main body 21a, and a front end portion of the inspection pin 30 may protrude from a front side of the second main body 21a. Also, the front end portion of the inspection pin 30 may be supported by a pin support 16. The pin support 16 is a plate-shaped body having a plurality of holes, and may be provided so that the front end portion of the inspection pin 30 is inserted into each hole. The pin support 16 may be manufactured as a separate component, or may be integrally manufactured with the second main body 21a or the first main body 11a.

According to this configuration, because an interval, that is, a creepage distance, between the inspection pins 30 may be maintained constant by the pin support 16 and the pin holder of the second main body 21a, the inspection pins 30 may be connected to the terminal pins P of the connector under test 200 without being misaligned with the terminal pins P.

The length adjusting bolt 22 may pass through a body of the second connector assembly 20 and may be screwed into the first fastening hole 14 of the first connector assembly 10 to a certain depth, and may be used as a means for variably adjusting a connection distance or a connection interval between the first connector assembly 10 and the second connector assembly 20.

In detail, in the present embodiment, the body of the second connector assembly 20 refers to the second wing body 21b of the second housing 21. As shown in FIG. 5, the second wing body 21b includes a through-hole 23. The through-hole 23 may be formed at a position corresponding to the first fastening hole 14 provided in the first wing body 11b in the first direction +Y, and thus, the length adjusting bolt 22 may be screwed into the first fastening hole 14 of the first wing body 11b through the through-hole 23 of the second wing body 21b.

A pair of length adjusting bolts 22 may be provided respectively on a left edge and a right edge of the second connector assembly 20. That is, the length adjusting bolts 22 may be inserted into the through-hole 23 of the second wing body 21b on a left side and the through-hole 23 of the second wing body 21b on a right side.

In this case, because a thread is not formed on an inner circumferential surface of the through-hole 23, the rod portion of the length adjusting bolt 22 may be screwed only into the first fastening hole 14 of the first wing body 11b.

Figure 6:
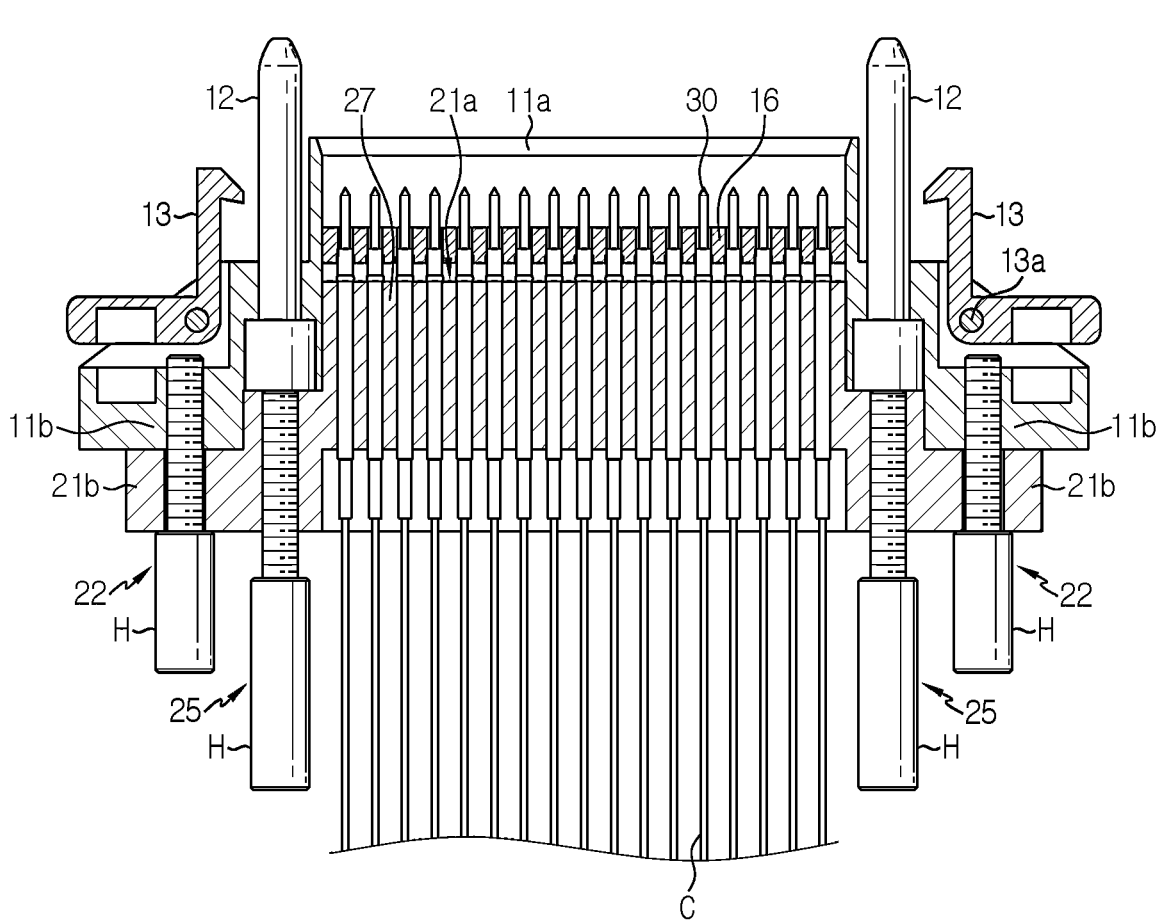
FIGS. 6 and 7 are views illustrating an example where a connection distance of a pin push inspection connector is adjusted according to an embodiment of the present disclosure.

Accordingly, when the length adjusting bolt 212 is continuously turned clockwise, the length adjusting bolt 22 may move forward in the first direction +Y, a head portion H may contact a surface of the second wing body 21b, and finally, the second wing body 21b is pushed by the head portion H to contact the first wing body 11b as shown in FIG. 6. As such, when the first wing body 11b and the second wing body 21b contact each other, a connection interval between the first connector assembly 10 and the second connector assembly 20 is '0 mm'.

In this state, when the length adjusting bolt 22 is slightly turned counterclockwise, the length adjusting bolt 22 is released from the first fastening hole 14 and moves little by little in the second direction −Y. In this case, because the head portion H of the length adjusting bolt 212 is separated from the surface of the second wing body 21b in the second direction −Y, a connection interval between the first connector assembly 10 and the second connector assembly 20 may be increased.

Finally, when the length adjusting bolt 22 is separated from the first fastening hole 14 of the first wing body 11b, the first connector assembly 10 and the second connector assembly 20 may be completely separated from each other with a slight force.

According to this configuration of the present disclosure, in a state where a connection interval between the first connector assembly 10 and the second connector assembly 20 is '0 mm', for example, when positions of the inspection pins 30 are to be moved backward by 1 mm or 2 mm in the second direction −Y, a connection interval between the first connector assembly 10 and the second connector assembly 20 may be adjusted to be 1 mm or 2 mm by releasing the length adjusting bolt 22 from the first fastening hole 14 little by little.

The length fixing bolt 25 may be screwed into a second fastening hole 26 passing through the body of the second connector assembly 20 in the first direction +Y to support the rear end portion of the first connector assembly 10, and may be used as a means for preventing a connection interval between the first connector assembly 10 and the second connector assembly 20 which is increased by the length adjusting bolt 22 from being reduced again.

A pair of length fixing bolts 25 may be provided between two length adjusting bolts 22 and may be respectively inserted into the second fastening hole 26 perforated in the second wing body 21*b* on a left side and the second fastening hole 26 perforated in the second wing body 21*b* on a right side.

Because a thread is formed on an inner circumferential surface of the second fastening hole 26, the length fixing bolt 25 may be screwed into the second fastening hole 26. The length fixing bolt 25 may pass through the second fastening hole 26, and a front end portion of the length fixing bolt 25 may support the rear end portion of the first connector assembly 10.

In more detail, the second fastening hole 26 may be formed at a position corresponding to a rear end of the guide pin 12 located on the first wing body 11*b*, the length fixing bolt 25 may be screwed into the second fastening hole 26, and the front end portion of the length fixing bolt 25 may pass through the second fastening hole 26 to support the rear end of the guide pin 14.

Figure 7:
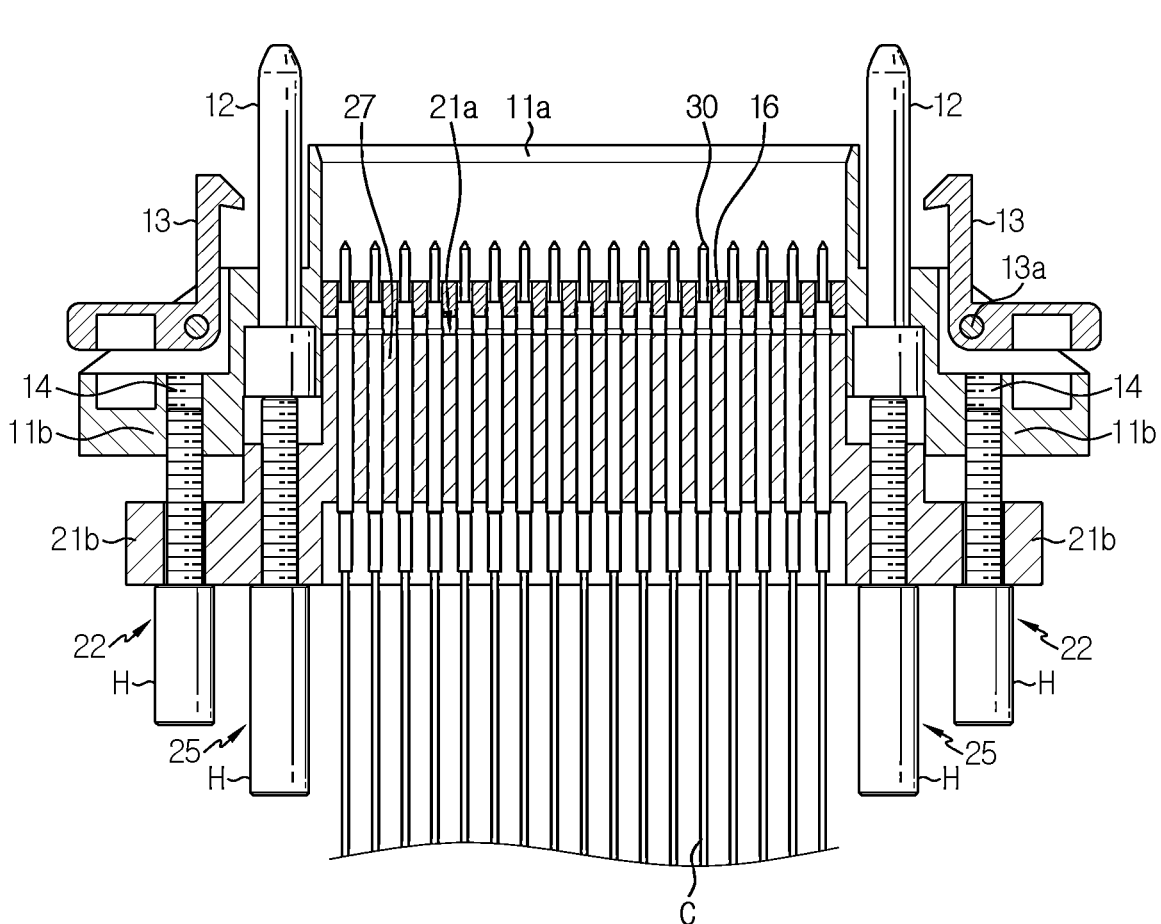

For example, in a state as shown in FIG. 6, when the length adjusting bolt 22 is released from the first fastening hole 14, the second connector assembly 20 is separated backward from the first connector assembly 10 by about 3 mm, and the length fixing bolt 25 is left as it is, a connection interval between the first connector assembly 10 and the second connector assembly 20 is likely to be reduced again even with slight impact. Accordingly, in this case, when the length fixing bolt 25 is turned clockwise to move forward in the first direction +Y, as shown in FIG. 7, the length fixing bolt 25 supports the rear end portion of the first connector assembly 10, that is, the rear end of the guide pin 12. Accordingly, even when there is impact, a connection interval between the first connector assembly 10 and the second connector assembly 20 which is increased by the length adjusting bolt 22 is not reduced again.

As described above, the pin push inspection connector 100 according to an embodiment of the present disclosure includes the first connector assembly 10 fixed to the connector under test 200 and the second connector assembly 20 connected to the first connector assembly 10 by variably adjusting a connection interval. The inspection pins 30 to be connected to the terminal pins P of the connector under test 200 are configured to move integrally with the second connector assembly 20 in the first direction +Y or the second direction −Y.

An example of use of the pin push inspection connector 100 will be briefly described as follows.

For example, when inspection is performed on the connector under test 200 assuming that a product in which a pin push of each terminal pin P is 2 mm or more is a defective product, a connection interval of the pin push inspection connector 100 is set to '0 mm'. (It is assumed that when a connection interval between the first connector assembly 10 and the second connector assembly 20 is '0 mm', a connection length between the inspection pin 30 and the terminal pin P with no pin push is 2 mm). Next, the pin push inspection connector 100 is connected to the connector under test 200 and a continuity test is performed.

Figure 8:
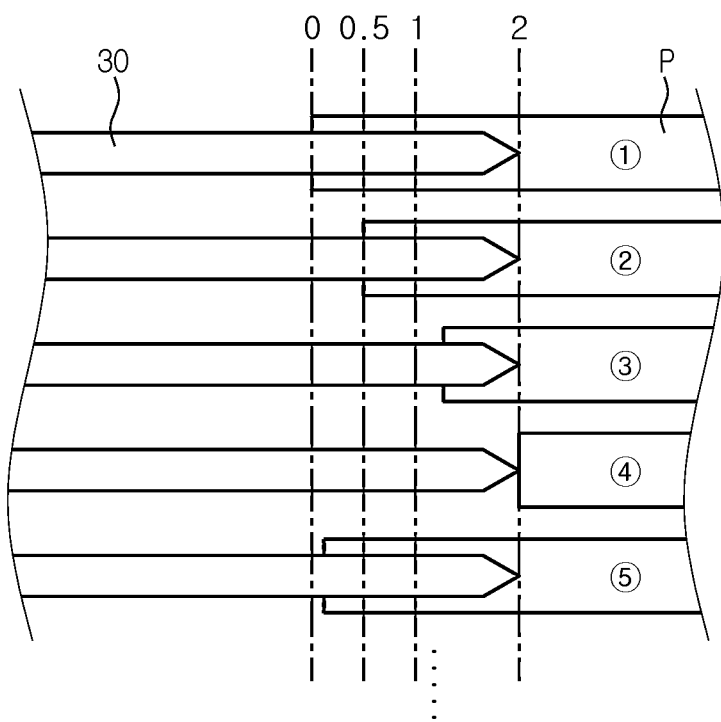
FIGS. 8 and 9 are reference views for describing an example where a contact point between inspection pins and terminal pins of a connector under test is adjusted according to an embodiment of the present disclosure.

In this case, referring to FIG. 8, because the terminal pin P ④ and the inspection pin 30 corresponding thereto do not contact each other, current does not flow therethrough. Accordingly, it may be detected that the terminal pin P ④ is pushed by 2 mm or more and assembled.

In another example, when inspection is performed on the connector under test 200 assuming that a product in which a pin push of each terminal pin P is 1 mm or more is a defective product, a connection interval of the pin push inspection connector 100 is increased by 1 mm, the pin push inspection connector 100 is connected to the connector under test 200, and then a continuity test is performed.

Figure 9:
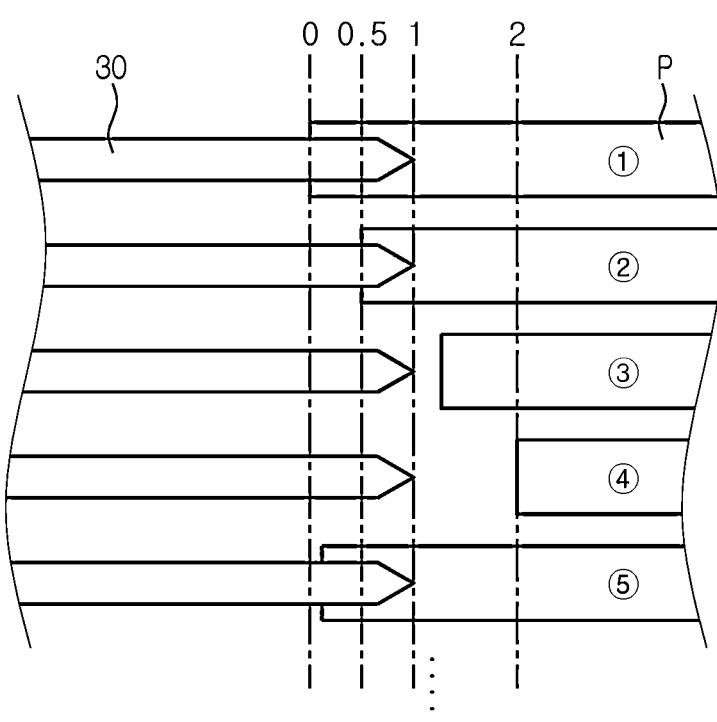

In this case, referring to FIG. 9, because the terminal pin P ③ and the terminal pin P ④ do not contact the inspection pins 30 corresponding thereto, current does not flow therethrough. Accordingly, it may be detected that the terminal pin P ③ and the terminal pin P ④ are pushed by 1 mm or more and assembled.

In another example, the pin push inspection connector 100 in which a connection interval is initially set to '0 mm' is connected to the connector under test 200, and then, a continuity test is performed by sequentially increasing a connection interval by 0.5 mm. In this case, the terminal pins P having a pin push of 0.5 mm or less, 0.5 mm to 1.0 mm, 1.0 mm to 1.5 mm, 1.5 mm to 2.0 mm, and 2 mm or more may be detected.

As described above, according to a configuration and an operation of the pin push inspection connector 100 according to the present disclosure, because a contact point with the terminal pins P of the connector under test 200 may be variably adjusted, whether the terminal pins P of the connector under test 200 are pushed may be easily determined even without performing existing X-ray imaging or Dino inspection.

While one or more embodiments of the present disclosure have been described with reference to the figures, the present disclosure is not limited to the above-described specific embodiments, and it will be understood by one of ordinary skill in the art that various changes in form and details may be made therein without departing from the scope as defined by the following claims.

It will be understood by one of ordinary skill in the art that when terms indicating directions such as upper, lower, left, and right, are used, these terms are only for convenience of explanation and may vary according to a position of a target object, a position of an observer, etc.

What is claimed is:

1. A pin push inspection connector comprising:

a first connector assembly having a front portion configured to connect to a connector under test in a first direction and to be fixedly coupled to the connector under test; and a second connector assembly having a front portion connected to a rear portion of the first connector assembly in the first direction and provided so that a connection interval with respect to the first connector assembly is variably adjusted in the first direction or a second direction that is opposite to the first direction, wherein the second connector assembly comprises at least one inspection pin provided therein and the at least one inspection pin extends in the first direction to be connected to at least one terminal pin provided in the connector under test, wherein the first connector assembly comprises a first fastening hole extending in the first direction from a rear end portion of the first connector assembly, and the second connector assembly comprises a length adjusting bolt passing through a body of the second connector assembly in the first direction via a through-hole without being screwed to the body of the second connector assembly, and the length adjusting bolt being screwed into the first fastening hole of the first connector assembly to a certain depth, the through-hole not having a thread on an inner circumferential surface thereof, wherein the second connector assembly further comprises a second fastening hole extending in the first direction and having a thread formed on an inner circumferential surface thereof, and a length fixing bolt screwed into the second fastening hole and provided to support the rear end portion of the first connector assembly, and wherein the through-hole and the second fastening hole in the second connector assembly are separated from each other in the second direction and are arranged parallel to each other.

2. The pin push inspection connector according to claim 1, wherein the length adjusting bolt is provided in a pair, and the pair of length adjusting bolts are respectively provided on a left edge and a right edge of the second connector assembly.

3. The pin push inspection connector according to claim 2, wherein the length fixing bolt is provided in a pair, and the pair of length fixing bolts are provided between the pair of length adjusting bolts.

4. The pin push inspection connector according to claim 1, wherein the at least one inspection pin is fixed in the second connector assembly to move integrally with the second connector assembly in the first direction or the second direction with respect to the first connector assembly.

5. The pin push inspection connector according to claim 1, wherein the first connector assembly comprises a latch provided to be engaged with a locking protrusion provided on an outer portion of the connector under test.

6. The pin push inspection connector according to claim 1, wherein the first connector assembly comprises:
   a first housing comprising a first main body formed in a hollow structure and a first wing body integrally formed on opposite sides of the first main body; and
   a guide pin extending from the first wing body in the first direction beyond the first main body.

7. The pin push inspection connector according to claim 1, wherein the first connector assembly comprises:
   a first housing comprising a first main body formed in a hollow structure and a first wing body integrally formed on opposite sides of the first main body; and
   a guide pin extending from the first wing body in the first direction beyond the first main body,
   wherein the length fixing bolt is provided so that a front end portion of the length fixing bolt supports a rear end of the guide pin located on the first wing body.

8. The pin push inspection connector according to claim 1, wherein the at least one inspection pin comprises a plurality of inspection pins provided to be connected in a one-to-one plug-in manner to each terminal pin of the connector under test.

9. The pin push inspection connector according to claim 1, wherein the length fixing bolt passes through the body of the second connector assembly.

10. The pin push inspection connector according to claim 7, wherein the guide pin extending from the first wing body in the first direction beyond the first main body is aligned with the length fixing bolt in the first direction.

11. The pin push inspection connector according to claim 1, wherein the at least one inspection pin and the length adjusting bolt are arranged parallel to each other.

12. The pin push inspection connector according to claim 7, wherein the second connector assembly comprises:
   a second housing comprising a second main body partially inserted into the first main body and a second wing body integrally formed on opposites sides of the second main body; and
   an inspection pin supported by a pin holder of the second main body and having a front end portion protruding from a front side of the second main body.

* * * * *